United States Patent

Nawaki

[11] Patent Number: 6,081,450
[45] Date of Patent: *Jun. 27, 2000

[54] NON-VOLATILE SEMICONDUCTOR MEMORY DEVICE IN WHICH READ, WRITE AND ERASE OPERATIONS CAN BE SIMULTANEOUSLY PERFORMED IN DIFFERENT MEMORY CELL ARRAY BLOCKS

[75] Inventor: Masaru Nawaki, Nara, Japan

[73] Assignee: Sharp Kabushiki Kaisha, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/947,086

[22] Filed: Oct. 8, 1997

[30] Foreign Application Priority Data

Nov. 14, 1996  [JP]  Japan .................................. 8-302269

[51] Int. Cl.[7] .................................................. G11C 16/04
[52] U.S. Cl. ............................. 365/185.11; 365/185.13; 365/185.23
[58] Field of Search ......................... 365/185.11, 185.13, 365/185.23

[56] References Cited

U.S. PATENT DOCUMENTS 5,621,690  4/1997  Jungroth et al. ......................... 365/200
5,717,636  2/1998  Dallabora et al. .................. 365/185.13

*Primary Examiner*—David Nelms
*Assistant Examiner*—Hoai V. Ho
*Attorney, Agent, or Firm*—Morrison & Foerster LLP

[57] ABSTRACT

A non-volatile semiconductor memory device of the present invention includes a plurality of memory cell array blocks on a single integrated circuit. Each of the blocks includes non-volatile memory transistors capable of electrically writing, erasing, and reading information, the transistors being arranged in a matrix, and sources of all of the transistors being commonly connected; a plurality of word lines for commonly connecting control gates of the transistors in each identical row of the matrix; a plurality of bit lines for commonly connecting drains of the transistors in each identical column of the matrix; wherein the plurality of word lines of each of the blocks are respectively connected to the corresponding word lines in an adjacent block through a group of switching transistors provided between the blocks.

5 Claims, 6 Drawing Sheets

NON-VOLATILE SEMICONDUCTOR MEMORY DEVICE IN WHICH READ, WRITE AND ERASE OPERATIONS CAN BE SIMULTANEOUSLY PERFORMED IN DIFFERENT MEMORY CELL ARRAY BLOCKS

BACKGROUND OF THE INVENTION

1. Field of the Invention

The present invention relates to an electrically writable/erasable non-volatile semiconductor memory device. In particular, the present invention relates to a non-volatile semiconductor memory device having a structure in which a read operation and a write/erase operation in connection with a particular memory cell can be simultaneously performed on one chip.

2. Description of the Related Art

FIG. 4 is a circuit configuration diagram of a conventional non-volatile semiconductor memory device (one chip flash memory in which data is erasable on a block basis). According to this conventional example, a floating gate type MOS transistor is used as a non-volatile memory transistor, which has a floating gate and allows data to be written by injection of channel hot electrons and to be erased by tunnel erasing by a Fowler-Nordheim current.

As shown in FIG. 4, in each of memory cell array blocks $BL_1, BL_2, \ldots, BL_K$, the above-mentioned floating gate type MOS transistors are arranged in a matrix. Control gates of the transistors in each identical row are commonly connected to form word lines $W_1, W_2, \ldots, W_M$. Drains of the transistors in each identical column are commonly connected to form bit lines $B_{1\text{-}1}, \ldots, B_{1\text{-}N}, B_{2\text{-}1}, \ldots, B_{2\text{-}N}, \ldots, B_{K\text{-}1}, \ldots, B_{K\text{-}N}$. Furthermore, sources of all the transistors arranged in the matrix are commonly connected so as to form common sources $S_1, \ldots, S_K$. The word lines in each block are commonly connected to the corresponding ones. The memory cell array blocks $BL_1, \ldots, BL_K$ respectively have column decoders $YD_1, \ldots, YD_K$ which selectively connect the plurality of bit lines to a data bus D-BUS in accordance with a signal value of a column selection signal portion of an input address signal at the time of writing and reading data. The memory cell array blocks $BL_1, \ldots, BL_K$ respectively have output circuits $SV_1, \ldots, SV_K$ for selectively outputting a predetermined voltage to the common sources $S_1, \ldots, S_K$ at the time of writing, erasing, and reading data (i.e., GND (ground voltage) at the time of writing and reading data; $V_{HH}$ (high voltage) at the time of erasing data). The output circuits $SV_1, \ldots, SV_K$ respectively have P-channel MOS transistors $P_{11}, \ldots, P_{K1}$ for applying a high voltage $V_{HH}$ and N-channel MOS transistors $N_{11}, \ldots, N_{K1}$ for applying a ground voltage GND. Furthermore, a row decoder XD outputs a predetermined word line selection signal commonly to the word lines of each of the memory cell array blocks $BL_1, \ldots, BL_K$ in accordance with a signal value of a row selection signal portion of an input address signal. An N-channel MOS transistor $N_1$ applies a predetermined high voltage $V_{PP}$ for writing to the data bus D-BUS, and a sense amplifier SA senses, amplifies, and outputs a current of the data bus D-BUS at the time of reading data.

Hereinafter, the operations of the above-mentioned conventional semiconductor memory device will be described.

First, a data write operation will be described. For description, the case where data is written in a memory cell $M_{2\text{-}22}$ at a crossed point of the word line $W_2$ and the bit line $B_{2\text{-}2}$ provided in the memory cell array block $BL_2$ will be described.

In order to fix the common source $S_2$ of the memory cell array block $BL_2$ at a GND level, a control signal $P/R_2$ is set at "H" to turn on a transistor $N_{21}$, whereby the common source $S_2$ is set at the GND level. Simultaneously, the row decoder XD applies a high voltage of around 10 volts for writing to the word line $W_2$ based on an input address signal. Then, the column decoder $YD_2$ connects the data bus D-BUS to the bit line $B_{2\text{-}2}$. A high voltage is applied to the data bus D-BUS by setting a control signal PGEN at "H", and a voltage of around 6 volts is applied to the bit line $B_{2\text{-}2}$. This allows a current to flow from the bit line $B_{2\text{-}2}$ to the source $S_2$ in the memory cell $M_{2\text{-}22}$. Hot electrons generated at this time are injected into a floating gate of the memory cell $M_{2\text{-}22}$. Thus, writing of data is completed.

Secondly, a data erase operation will be described. For description, the case where data is erased from all the memory cells in the memory cell array block $BL_2$ will be described.

All the word lines $W_1, \ldots, W_M$ are set at the GND level by the row decoder XD. Thereafter, control signals $ER_{2\#}$ and $P/R_2$ are set at "L" so as to set the common source $S_2$ at a high voltage of around 10 volts during a predetermined period, whereby a high voltage of around 10 volts is applied between sources and control gates of all the memory cells in the memory cell array block $BL_2$. Electrons are ejected from the floating gates of all the memory cells. Thus, erasing of data is completed.

Finally, a data read operation will be described. For description, the case where data is read from the memory cell $M_{2\text{-}22}$ at a crossed point of the word line $W_2$ and the bit line $B_{2\text{-}2}$ provided in the memory cell array block $BL_2$ will be described.

The transistor $N_{21}$ is turned on by setting the control signal $P/R_2$ at "H", and the common source $S_2$ is set at the GND level. A voltage of around 5 volts for reading is applied to the word line $W_2$ by the row decoder XD, and a voltage of around 1 volt is applied to the bit line $B_{2\text{-}2}$ via the column decoder $YD_2$. A current flowing through the memory cells at this time is amplified by the sense amplifier SA. Thus, reading of data is performed.

The time required for the above-mentioned respective operations is as follows: the read operation is performed at a relatively high speed, i.e., about tens of nanoseconds, the write operation usually requires several microseconds to about ten microseconds, and the erase operation requires a relatively long period of time, i.e., about hundreds of milliseconds to about 1 second. The write operation includes a write verifying operation for checking whether or not the threshold value of the memory cell has reached a predetermined value after writing, and further requires a re-write operation if the threshold value has not reached the predetermined value. Therefore, the write operation requires a relatively long period of time.

The erase operation includes a write operation before erasing for the purpose of equalizing the threshold values of all the memory cells at the time of starting erasing, in addition to the erase verifying and re-erase operations similar to the write verifying and re-write operations. Therefore, the erase operation requires the longest period of time.

As described above, the write and erase operations require longer periods of time. Therefore, in the case where it is required to read data from a block while data is being erased or written in another block, a read operation is required to be performed with the erase or write operation being suspended. This is generally called "suspend".

However, the erase or write operation is completely suspended during the read operation. Therefore, in the case of a system in which the read operation is often performed, e.g., a system in which program for controlling a system is stored in a flash memory, it is practically impossible to write data in or erase it from the identical flash memory while reading the system control program (instruction code) stored in the flash memory.

One strategy to overcome the above-mentioned problem is to provide two flash memory devices in a system. In this case, the following problem will remain unsolved.

More specifically, in a mobile phone which is required to be light-weight and miniaturized, it is necessary to minimize the number of devices mounted on a system. Thus, providing two separate devices is disadvantageous. Even when two flash memory devices are used, while data is being read from one flash memory device, data can be written in or erased from only the other device. In other words, once a system is constructed, a region where data is simultaneously read and written or erased cannot be varied. In general, the size of a region where program (instruction code) for controlling a system is stored is different from that of a data region where data is written or erased. The ratio therebetween may be altered even in the identical system in the case where the system is upgraded.

In order to solve the problem related to light-weight and miniaturization, two memory regions in which completely independent operations can be performed may be formed in one flash memory device. FIG. 5 shows one such example. In this example, the word lines are completely isolated from each other at the center thereof to form two word line blocks ($W_{1-1}$, $W_{1-2}$, ..., $W_{1-M}$) and ($W_{2-1}$, $W_{2-2}$, ..., $W_{2-M}$), and row decoders $XD_1$ and $XD_2$ are provided for the respective blocks. More specifically, memory cell array blocks $BL_1$ through $BL_{K/2}$ are driven by the row decoder $XD_1$, and the memory cell array blocks $BL_{K/2+1}$ to $BL_K$ are driven by the row decoder $XD_2$.

However, even in this example shown in FIG. 5, data cannot be simultaneously read and written or erased, for example, with respect to the memory cell array blocks $BL_1$ and $BL_2$. This is because the memory cell array blocks $BL_1$ and $BL_2$ have the word lines in common.

In order to allow the operations of each memory cell array block to be completely independently performed, the memory cell array blocks $BL_1$, $BL_2$, ..., $BL_K$ may be respectively provided with independent word lines ($W_{1-1}$, $W_{1-2}$, ..., $W_{1-M}$), ($W_{2-1}$, $W_{2-2}$, ..., $W_{2-M}$), ..., and ($W_{K-1}$, $W_{K-2}$, ..., $W_{K-M}$), so that the memory cell array blocks $BL_1$, $BL_2$, ..., $BL_K$ can be respectively driven by completely independent row decoders $XD_1$, $XD_2$, ..., $XD_K$, as shown in FIG. 6. In this case, a layout area remarkably increases. This is also disadvantageous.

SUMMARY OF THE INVENTION

A non-volatile semiconductor memory device of the present invention includes a plurality of memory cell array blocks on a single integrated circuit, each of the blocks including non-volatile memory transistors capable of electrically writing, erasing, and reading information, arranged in a matrix. Sources of all of the transistors are commonly connected. The semiconductor memory device of the present invention also includes a plurality of word lines for commonly connecting control gates of the transistors in each identical row of the matrix; a plurality of bit lines for commonly connecting drains of the transistors in each identical column of the matrix; a bit line selection circuit for selectively connecting the plurality of bit lines to a data bus in accordance with a signal value of a first predetermined portion of an input address signal; and a voltage selection output circuit for selectively outputting a predetermined voltage to the commonly connected sources at a time of writing, erasing, or reading information. The plurality of word lines of each of the blocks are respectively connected to the corresponding word lines in an adjacent block through a group of switching transistors provided between the blocks. In the semiconductor memory device of the present invention, at least two word line selection circuits are further included which output a predetermined word line selection signal in accordance with a signal value of second predetermined portion of the input address signal; the plurality of word lines of a predetermined pair of two blocks among the plurality of blocks are respectively connected to the corresponding word line selection circuits; and each of the bit line selection circuits connects the bit line selected in accordance with the signal value of the predetermined portion of the input address signal alternatively to either of the two data buses.

In one embodiment of the present invention, the gates of the plurality of switching transistors provided between the blocks are commonly connected on an interblock basis and supplied with a predetermined transistor ON or OFF voltage.

In another embodiment of the present invention, the above-mentioned semiconductor memory device further includes a storage circuit whose stored content is variable, and a transistor switching voltage output circuit for selectively outputting the transistor ON or OFF voltage in accordance with the content stored in the storage circuit.

In still another embodiment of the present invention, each of the groups of switching transistors includes N channel MOS transistors and P channel MOS transistors respectively connected to the corresponding word lines of the adjacent blocks.

In still another embodiment of the present invention, the plurality of the word lines of each of the blocks respectively include global word lines for connecting between the blocks, and local word lines for commonly connecting the control gates of the transistors of each identical row of the matrix within each block.

In the non-volatile semiconductor memory device according to the present invention, switching transistors (MOS transistors) provided between memory cell array blocks allow the respective word lines to be electrically isolated between any blocks. Thus, block regions where data is simultaneously read and written or erased can be arbitrarily set. Furthermore, the switching transistors are merely provided between the respective blocks in addition to two word line selection circuits (row decoders), so that the increase in a chip layout area can be minimized.

Furthermore, by arbitrarily varying a control voltage applied to the switching transistors, a word line isolating position can be arbitrarily varied.

Thus, the invention described herein makes possible the advantage of providing a non-volatile semiconductor memory device in which data can be read from one memory cell array block while data is being written in or erased from another memory cell array block on one chip, with the increase in chip layout area being minimized.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described in detail by way of illustrative examples with reference to the drawings.

EXAMPLE 1

Figure 1:
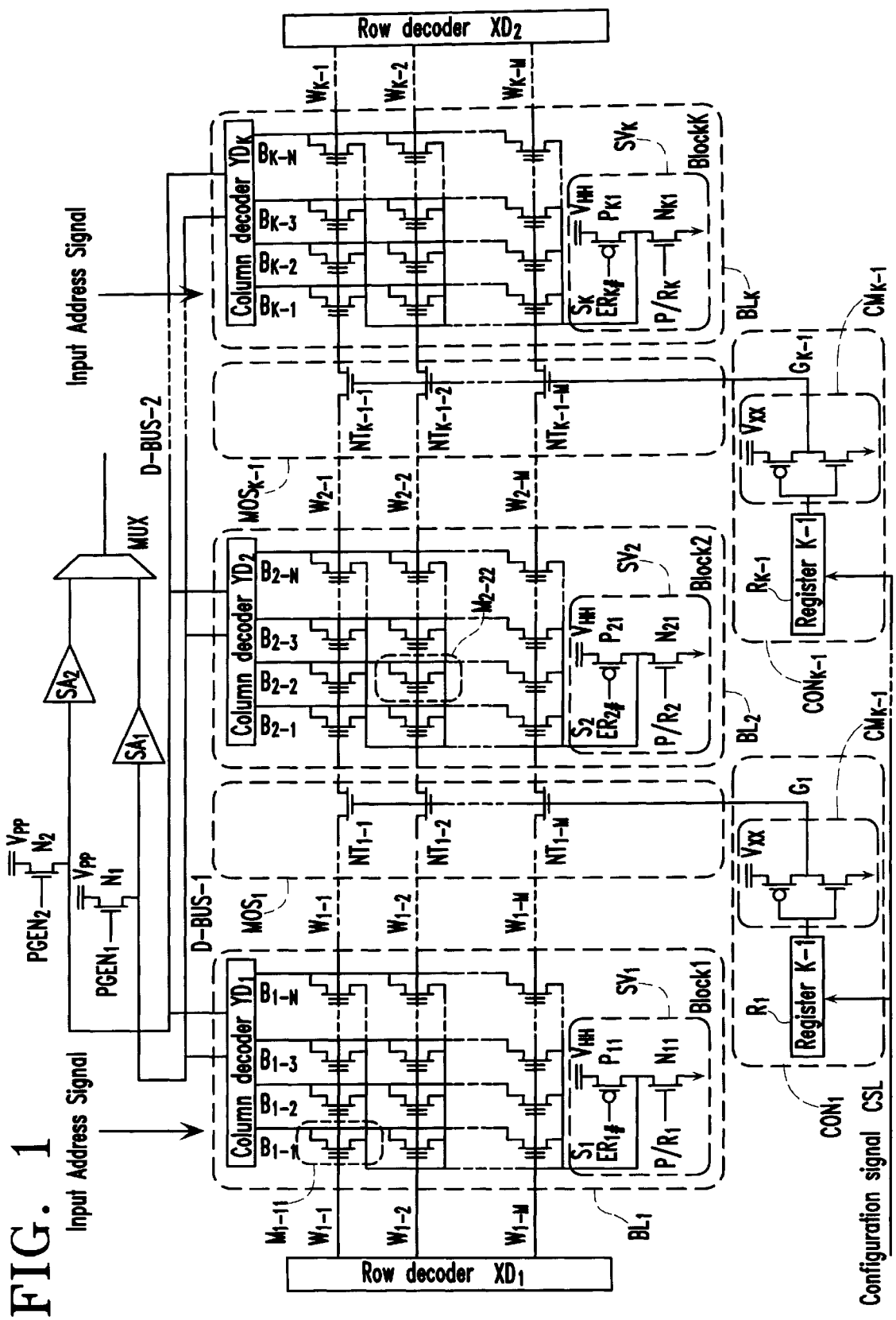
FIG. 1 is a block diagram of the first example according to the present invention.

FIG. 1 is a circuit configuration diagram of a non-volatile semiconductor memory device (one chip flash memory in which data is erasable on a block basis) of Example 1 according to the present invention.

According to the present example, a floating gate type MOS transistor is used as a non-volatile memory transistor, which has a floating gate and allows data to be written by injection of channel hot electrons and to be erased by tunnel erasing by a Fowler-Nordheim current.

As shown in FIG. 1, in each of memory cell array blocks $BL_1, BL_2, \ldots, BL_K$, the above-mentioned floating gate type MOS transistors are arranged in a matrix. Control gates of the transistors in each identical row are commonly connected to form word lines $(W_{1-1}, W_{1-2}, \ldots, W_{1-M})$, $(W_{2-1}, W_{2-2}, \ldots, W_{2-M}), \ldots, (W_{K-1}, W_{K-2}, \ldots, W_{K-M})$. Drains of the transistors in each identical column are commonly connected to form bit lines $(B_{1-1}, \ldots, B_{1-N}), (B_{2-1}, \ldots, B_{2-N}), \ldots, (B_{K-1}, \ldots, B_{K-N})$. Furthermore, sources of all the transistors arranged in the matrix are commonly connected to form common sources $S_1, \ldots, S_K$. The memory cell array blocks $BL_1, \ldots, BL_K$ respectively have column decoders $YD_1, \ldots, YD_K$ which connect bit lines, selected in accordance with a signal value of a column selection signal portion of an input address signal, alternatively to a data bus D-BUS-1 or D-BUS-2 at the time of writing and reading data. The memory cell array blocks $BL_1, \ldots, BL_K$ respectively have output circuits $SV_1, \ldots, SV_K$ for selectively outputting a predetermined voltage to the common sources $S_1, \ldots, S_K$ at the time of writing, erasing, and reading data (i.e., GND (ground voltage) at the time of writing and reading data, and $V_{HH}$ (high voltage) at the time of erasing data). The output circuits $SV_1, \ldots, SV_K$ respectively have P-channel MOS transistors $P_{11}, \ldots, P_{K1}$ for applying a high voltage $V_{HH}$ and N-channel MOS transistors $N_{11}, \ldots, N_{K1}$ for applying a ground voltage GND.

In the present example, two row decoders $XD_1$ and $XD_2$ are provided. More specifically, the row decoders $XD_1$ and $XD_2$ output a predetermined word line selection signal in accordance with a signal value of a row selection signal portion of an input address signal. Row decoder $XD_1$ is connected to the respective word lines $W_{1-1}, \ldots, W_{1-M}$ of the memory cell array block $BL_1$. Row decoder $XD_2$ is connected to the respective word lines $W_{K-1}, \ldots, W_{K-M}$ of the memory cell array block $BL_K$.

In the present example, two data buses D-BUS-1 and D-BUS-2 are provided for the purpose of simultaneously performing a read operation and a write operation. N-channel MOS transistors $N_1$ and $N_2$ respectively apply a predetermined high voltage $V_{PP}$ for writing to the data buses D-BUS-1 and D-BUS-2 at the time of writing data. Sense amplifiers $SA_1$ and $SA_2$ respectively sense, amplify, and output currents of the data buses D-BUS-1 and D-BUS-2 at the time of reading data. Furthermore, a multiplexer MUX selectively outputs an output signal of the sense amplifier $SA_1$ or $SA_2$ in accordance with a control signal.

Furthermore, switching MOS transistor groups $MOS_1, \ldots, MOS_{K-1}$ are interposed between the respective memory cell array blocks $BL_1, \ldots, BL_K$ (i.e., between the word lines of the respective blocks). The switching MOS transistor groups $MOS_1, \ldots, MOS_{K-1}$ respectively include a plurality of N-channel MOS transistors $(NT_{1-1}, \ldots, NT_{1-M}), \ldots, (NT_{K-1-1}, \ldots, NT_{K-1-M})$. Gates of each of the MOS transistor groups $MOS_1, \ldots, MOS_{K-1}$ are commonly connected so as to receive an identical control voltage.

Configuration circuits $CON_1, \ldots, CON_{K-1}$ respectively output control voltages $G_1, \ldots, G_{K-1}$ to the commonly connected gates of the switching MOS transistor groups $MOS_1, \ldots, MOS_{K-1}$. The configuration circuits $CON_1, \ldots, CON_{K-1}$ respectively include registers $R_1, \ldots, R_{K-1}$ and CMOS circuits $CM_1, \ldots, CM_{K-1}$ which selectively output the ground voltage GND or a voltage $V_{XX}$ in accordance with the content ("H" or "L") stored in the registers $R_1, \ldots, R_{K-1}$.

The switching MOS transistor groups $MOS_1, \ldots, MOS_{K-1}$ and the configuration circuits $CON_1, \ldots, CON_{K-1}$ are components characteristic of the present invention.

Hereinafter, a parallel operation of the read and write operations will be described.

The case where data is written in a memory cell $M_{2-22}$ of the memory cell array block $BL_2$ while data stored in a memory cell $M_{1-1}$ in the memory cell array block $BL_1$ is being read will be exemplified.

First, in order to electrically separate the word lines between the memory cell array blocks $BL_1$ and $BL_2$, the register $R_1$ is set at "H" and the registers $R_2$ to $R_{K-1}$ are set at "L" through a configuration signal line CSL. It is also possible for a user to set this configuration operation by entering a command after power-on. Alternatively, a manufacturer of flash memories may previously set the configuration operation prior to shipment.

When the register $R_1$ is set at "H", the gate control voltage $G_1$ of the MOS transistor group $MOS_1$, provided between the word lines $W_{1-1}, \ldots, W_{1-M}$ of the memory cell array block $BL_1$ and the word lines $W_{2-1}, \ldots, W_{2-M}$ of the memory cell array block $BL_2$, reaches the GND level, and the respective transistors $NT_{1-1}, \ldots, NT_{1-M}$ of the MOS transistor group $MOS_1$ are turned off. Thus, the word lines $W_{1-1}, \ldots, W_{1-M}$ of the memory cell array block $BL_1$ are electrically isolated from the word lines $W_{2-1}, \ldots, W_{2-M}$ of the memory cell array block $BL_2$.

When the registers $R_2$ to $R_{K-1}$ are set at "L", the gate control voltages $G_2, \ldots, G_{K-1}$ of the MOS transistor groups $MOS_2$ to $MOS_{K-1}$ between the other memory cell array blocks $BL_2$ to $BL_K$ reach a voltage $V_{XX}$ level, and each transistor of the MOS transistor groups $MOS_2$ to $MOS_{K-1}$ is turned on. Thus, the word lines are electrically connected to each other between the memory cell array blocks $BL_2$ to $BL_K$.

In accordance with the contents stored in the registers $R_1$ to $R_{K-1}$ in the configuration circuits $CON_1$ to $CON_{K-1}$, the row decoders $YD_1$ to $YD_K$ connect the selected bit lines to either of the data bus D-BUS-1 and D-BUS-2. Assuming that a register $R_i$ (i=1, ..., K–1) is set at "H", the column decoders $YD_1$ to $YD_i$ of the memory cell array blocks $BL_1$ to $BL_i$ connect the selected bit lines to the data bus D-BUS-1, and the column decoders $YD_{i+1}$ to $YD_K$ of the memory cell array blocks $BL_{i+1}$ to $BL_K$ connect the selected bit lines to the data bus D-BUS-2.

In order to read data from the memory cell $M_{1-11}$ of the memory cell array block $BL_1$, a control signal $P/R_1$ is set at "H" to turn on a transistor $N_{11}$, and the common source $S_1$ is set at a GND level. A voltage of around 5 volts for the read operation is applied to the word line $W_{1-1}$ by the row decoder $XD_1$. The data bus D-BUS-1 is connected to the bit line $B_{1-1}$ through the column decoder $YD_1$, whereby a voltage of around 1 volt is applied to the bit line $B_{1-1}$. A current flowing at this time is amplified by the sense amplifier $SA_1$. Thus, data is read. At this time, since the transistor $NT_{1-1}$ is in an OFF state, a voltage of around 5 volts applied to the word line $W_{1-1}$ is not transmitted to the word line $W_{2-1}$ and the word lines following thereafter.

In order to write data in the memory cell $M_{2-22}$ of the memory cell array block $BL_2$ in parallel with the read operation, a control signal $P/R_2$ is set at "H", and the common source $S_2$ is set at a GND level. A high voltage of around 10 volts for the write operation is applied to the word line $W_{K-2}$ by the row decoder $XD_2$. Each voltage $V_{XX}$ of the configuration circuits is set sightly higher than 10 volts (i.e., around 12 volts). The registers $R_2$, ..., $R_{K-1}$ are set at "L", so that the control voltages $G_2$ to $G_{K-1}$ are set at 12 volts. Because of this, each transistor of the switching MOS transistor groups between the memory cell array blocks $BL_2$ and $BL_K$ is conducted. Therefore, a voltage of 10 volts applied to the word line $W_{K-2}$ is directly transmitted to the word line $W_{2-2}$. Since the word lines $W_{K-1}, W_{K-3}, ..., W_{K-M}$ other than the word line $W_{K-2}$ are set at the GND level by the row decoder $XD_2$, the word lines $W_{2-1}, W_{2-3}, ..., W_{2-M}$ of the memory cell array block $BL_2$ are all set at the GND level. The control voltage $G_1$ of the switching MOS transistor group $MOS_1$ located between the memory cell array blocks $BL_1$ and $BL_2$ is at the GND level at this time. Therefore, each transistor of this MOS transistor group $MOS_1$ is in an OFF state, whereby a voltage of the word lines $W_{2-1}, ..., W_{2-M}$ of the memory cell array block $BL_2$ are not transmitted to the word lines $W_11, ..., W_{1-M}$ of the memory cell array block $BL_1$.

Next, a high voltage is applied to the data bus D-BUS-2 by setting a control signal $PGEN_2$ at "H". A voltage of around 6 volts is applied to the bit line $B_{2-2}$ via the column decoder $YD_2$, whereby data is written in the memory cell $M_{2-22}$. In order to verify whether or not data has been normally written in the memory cell $M_{2-22}$, data is read through the data bus D-BUS-2 by using the sense amplifier $SA_2$. When data is found not to have been normally written as a result of this reading, the re-write operation is performed.

As described above, while data is being read from a memory cell of the memory cell array block $BL_1$, data can be written in a memory cell of the memory cell array block $BL_2$, for example. By interposing the switching MOS transistor groups $MOS_1, ..., MOS_{K-1}$ between the respective memory cell array blocks, the memory cell array block $BL_1$ is operated completely independently from the memory cell array block $BL_2$, whereby the read and write operations can be simultaneously performed.

The case where the read and write operations are simultaneously performed has been described. Similarly, the read and erase operations or the write and erase operations can be simultaneously performed. It is also possible that data is simultaneously written in two memory cell array blocks. Furthermore, memory cell array blocks which are to be independently operated can be arbitrarily selected. For example, in the case where the memory cell array blocks $BL_2$ and $BL_3$ are desired to be independently operated, a register $R_2$ (not shown) is set at "H", and the other registers, i.e., registers $R_1$, $R_3$ (not shown), ..., $R_{k-1}$ are set at "L". In this case, each transistor of the switching MOS transistor group between the memory cell array blocks $BL_2$ and $BL_3$ are in an OFF state, and the word lines $W_{2-1}, ..., W_{2-M}$ of the memory cell array block $BL_2$ are electrically isolated from the word lines $W_{3-1}, ..., W_{3-M}$ of the memory cell array block $BL_3$.

As described above, depending upon the data set in the registers $R_1, ..., R_{K-1}$ the regions to be independently operated are arbitrarily set, and the setting can also be altered. Thus, the read and write operations, the write and erase operations, or the read and erase operations can be simultaneously performed in the regions operating independently from each other.

In the present example, a program storage portion and a data storage portion can be provided in one chip flash memory. Furthermore, the setting thereof can be arbitrarily performed.

EXAMPLE 2

Figure 2:
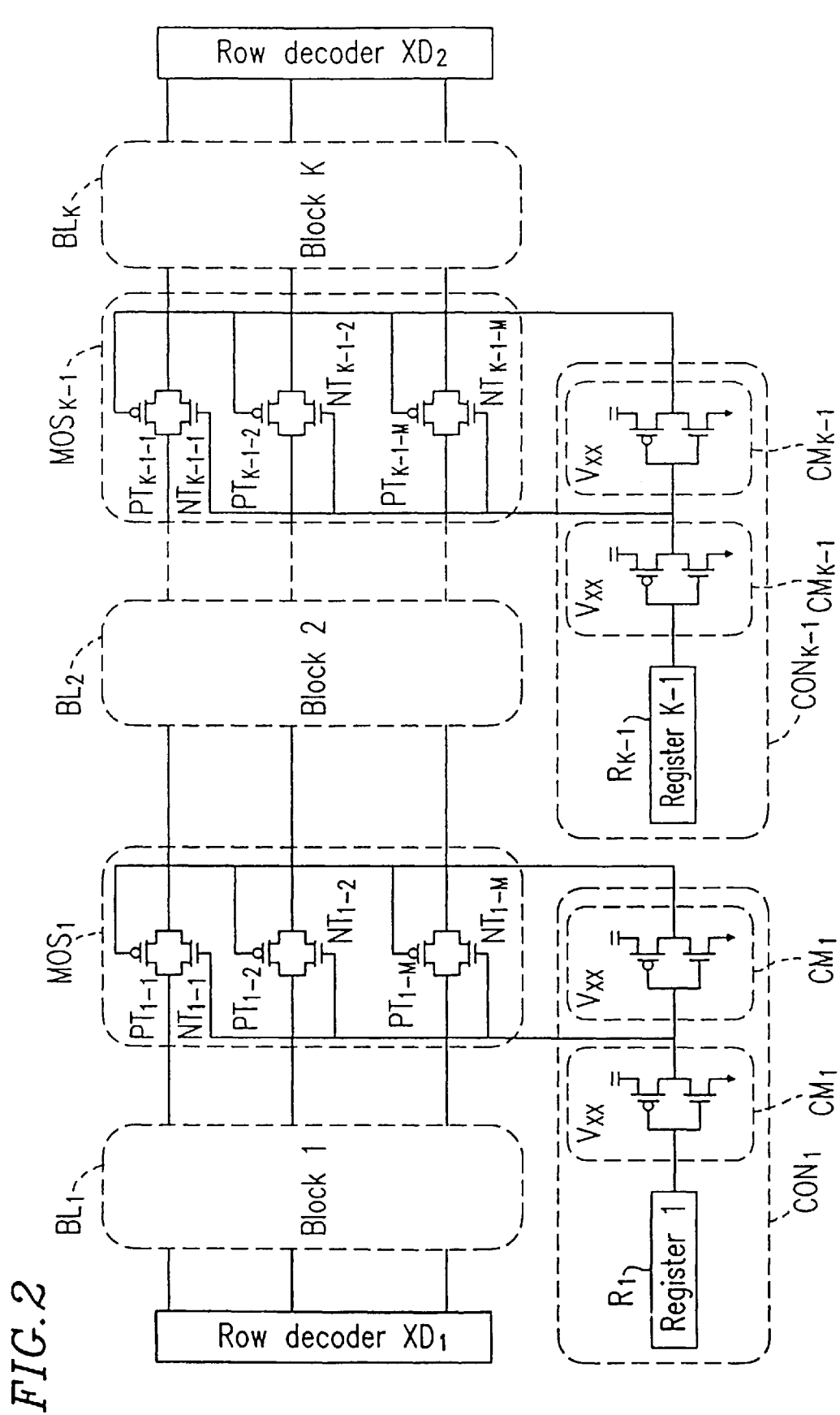
FIG. 2 is a block diagram of the second example according to the present invention.

FIG. 2 is a circuit configuration diagram of Example 2 according to the present invention. The difference between Examples 1 and 2 lies in the configuration of each switching MOS transistor group provided between memory cell array blocks. More specifically, in Example 1, the switching MOS transistor groups are composed of N-channel MOS transistors. In Example 2, P-channel MOS transistors ($PT_{1-1}, ..., PT_{1-M}$), ..., ($PT_{K-1-1}, ..., PT_{K-1-M}$) are connected in parallel to N-channel MOS transistors. Because of the above alteration, one more CMOS circuit $CM'_1, ..., CM'_{K-1}$ is added to each of the configuration circuits $CON_1, ..., CON_{K-1}$.

In Example 1, since the switching MOS transistor groups are composed of N-channel MOS transistors, a voltage $V_{XX}$ supplied to the configuration circuits is required to be made higher by around 2 volts than the word line voltage (10 volts) at the time of writing (for the purpose of preventing the decrease in a threshold voltage). In Example 2, since the switching MOS transistor groups are composed of CMOS, a voltage $V_{XX}$ supplied to the configuration circuit can be set at the identical level with that of the word line voltage at the time of writing.

EXAMPLE 3

Figure 3:
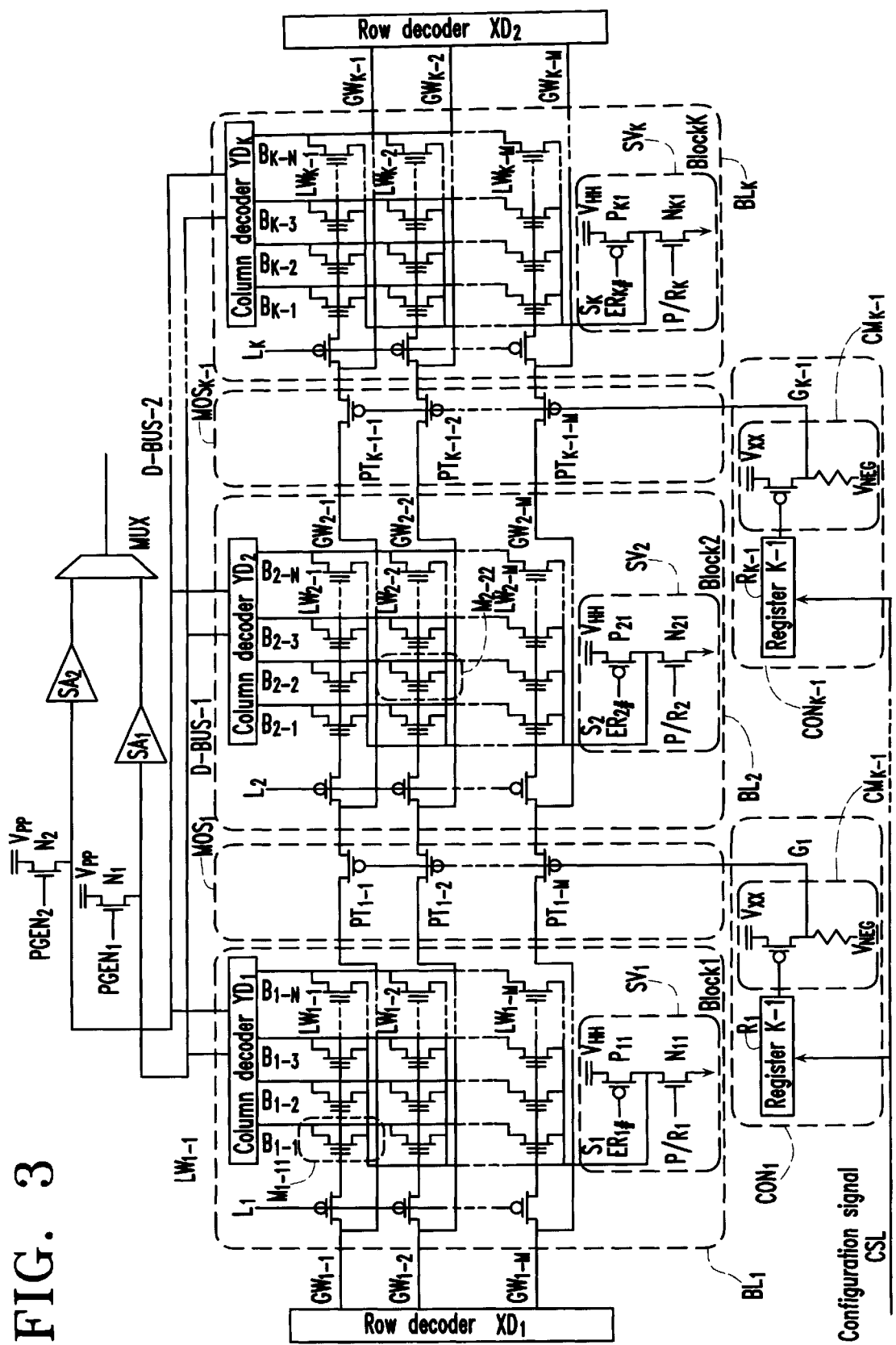
FIG. 3 is a block diagram of the third example according to the present invention.
Figure 4:
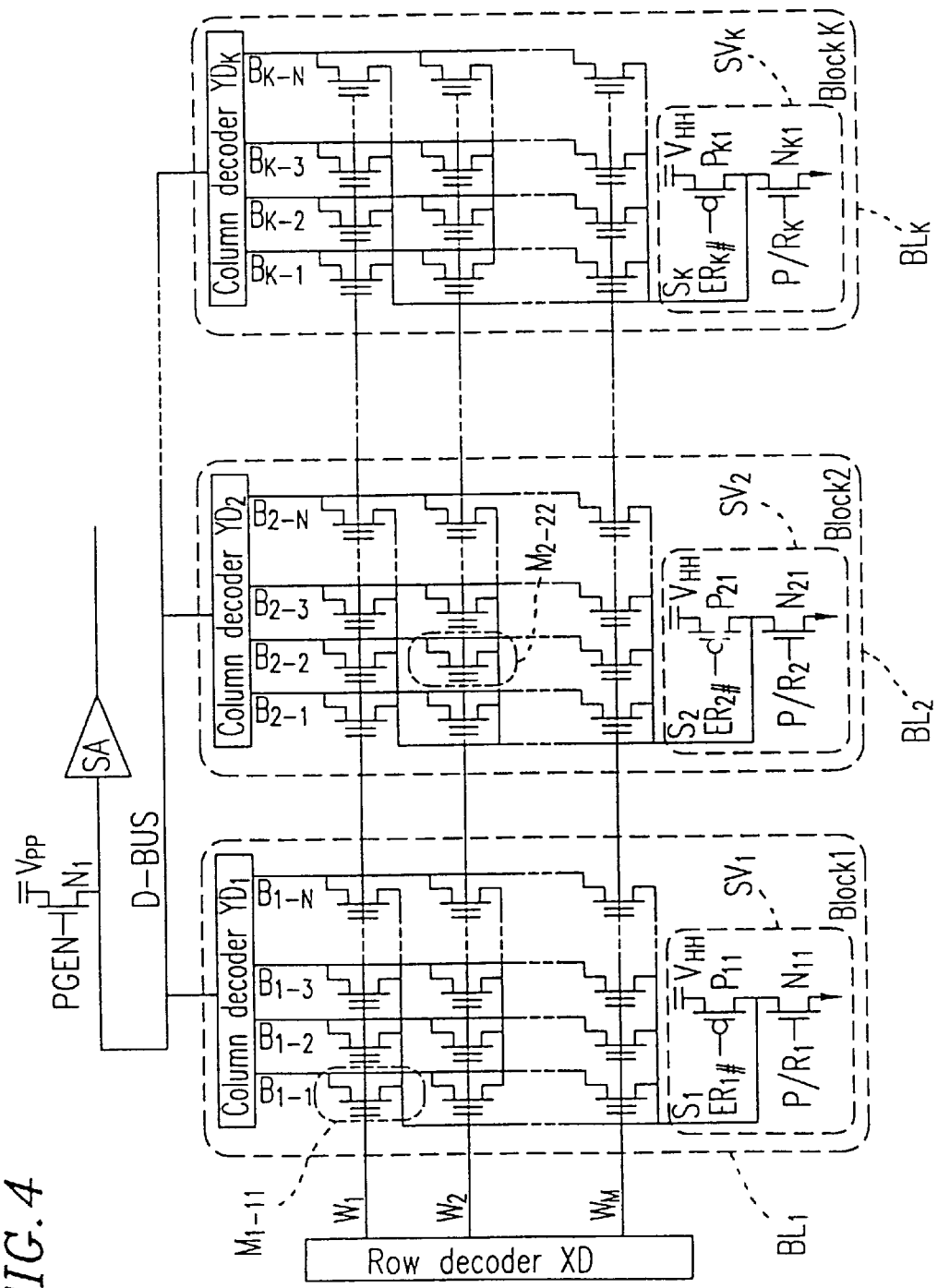
FIG. 4 is a block diagram of a conventional non-volatile semiconductor memory device.
Figure 5:
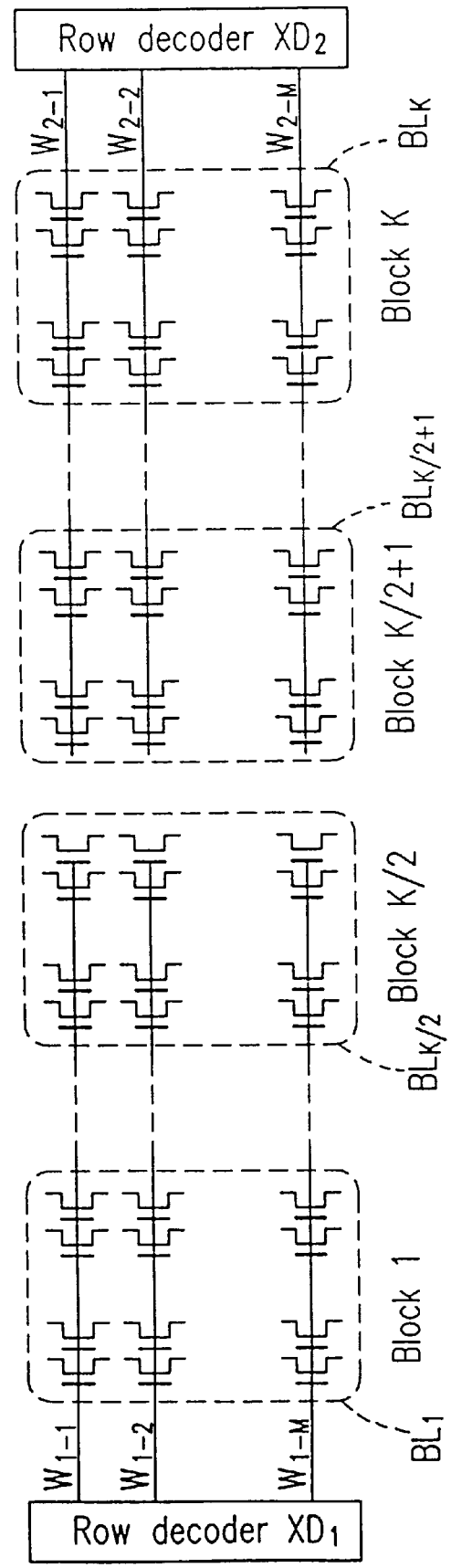
FIG. 5 is a block diagram of a conventional non-volatile semiconductor memory device.
Figure 6:
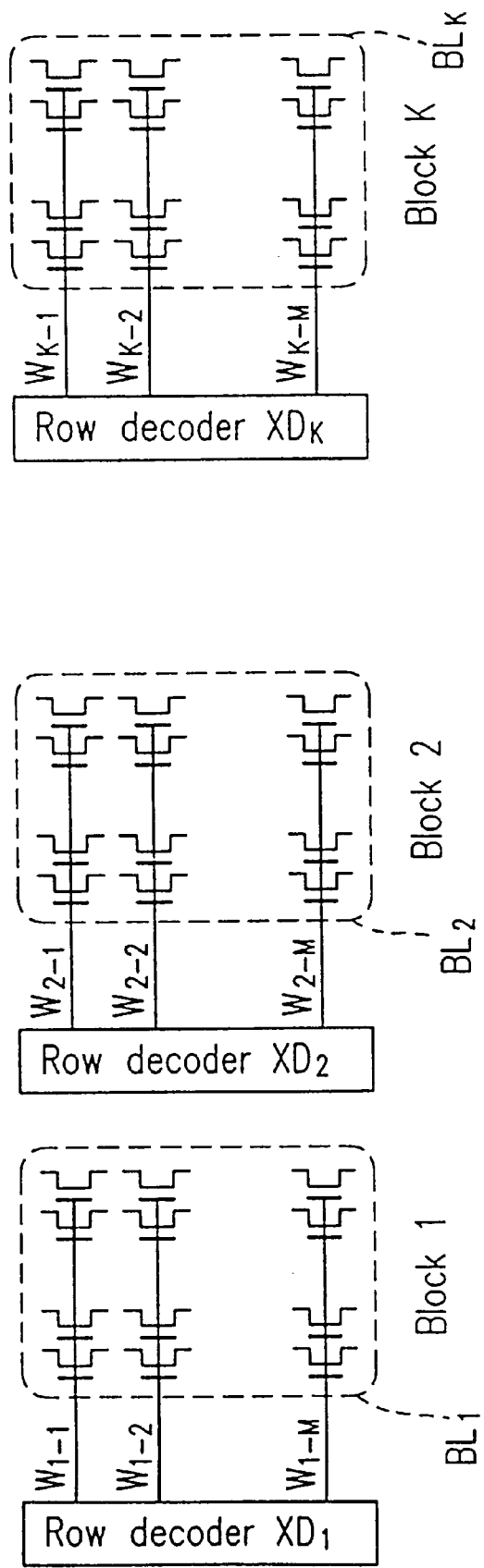
FIG. 6 is a block diagram of a conventional non-volatile semiconductor memory device.

FIG. 3 is a circuit configuration diagram of Example 3 according to the present invention.

In the present example, a method for erasing data by applying a negative voltage to word lines is adopted. According to this method, a voltage to be applied to word lines is set to be negative (i.e., around –10 volts) rather than the GND level. The purpose of this is to decrease the level of a high voltage applied to the sources of memory transistors. This method has the advantage that double diffusion for enhancing pressure resistance is not required in source portions, etc. In connection with the adoption of this method, word lines include global word lines ($GW_{1-1}, \ldots, GW_{1-M}$), ..., ($GW_{K-1}, \ldots, GW_{K-M}$), and local word lines ($LW_{1-1}, \ldots, LW_{1-M}$) ... ($LW_{K-1}, \ldots, LW_{K-M}$) which are suitable for erasing data with a negative voltage. In the present example, the number of memory cells, i.e., the number of bit lines in the memory cell array blocks from which data is independently erased, is different depending upon the block. In FIG. 3, the memory cell array block $BL_1$ has N bit lines, the memory cell array block $BL_2$ has L bit lines, ..., the memory cell array block $BL_K$ has J bit lines. In general, the memory block configuration as shown in FIG. 3 is called "boot block" configuration, whereas the memory block configuration as shown in FIG. 1 in which blocks having the identical number of memory cells are arranged is called "symmetrical block" configuration. Note that the boot block configuration as shown in FIG. 3 can be applied to the usual erasing method as shown in FIG. 1. The equivalent block configuration as shown in FIG. 1 can be applied to the method for erasing data by applying a negative voltage to word lines as shown in FIG. 3.

In FIG. 3, a negative voltage is applied to word lines at the time of erasing, so that P-channel MOS transistors are used as switching MOS transistors. If it is possible to use a triple well process even in the case of erasing data with a negative voltage, an N-channel MOS transistor can be formed in a P-well. This allows the electric potential of the P-well to be set at a predetermined negative voltage (i.e., voltage lower than a word line negative voltage at the time of erasing) independently from a P-substrate. Therefore, the switching MOS transistor groups composed of N-channel MOS transistors as shown in FIG. 1 or the switching MOS transistor groups composed of CMOS as shown in FIG. 2 can be used.

Hereinafter, a parallel operation of the read and erase operations will be described.

The case where data is erased from the memory cell $M_{2-22}$ of the memory cell array block $BL_2$ while data is being read from the memory cell array block $BL_1$ will be described.

First, a register $R_1$ is set at "L" and registers $R_2, \ldots, R_{K-1}$ are set at "H" for the purpose of electrically isolating the global word lines between the memory cell array blocks $BL_1$ and $BL_2$.

A voltage to be applied to word lines in the case of adopting a method for erasing data with a negative voltage is as follows:

Reading: 5 volts or GND
Writing: 10 volts or GND
Erasing: −10 volts

Thus, in any combination of the operations to be simultaneously performed, in order to bring the global word lines into conduction or electrically isolate them from each other, voltages $V_{XX}$ and $V_{NEG}$ to be supplied to the configuration circuits are required to be set, for example, at around 10 volts and around −12 volts. As a circuit for generating such a voltage, a charge pump circuit or the like can be used.

When the register $R_1$ is set at "L", the control voltage $G_1$ of the switching MOS transistor group $MOS_1$ between the memory cell array blocks $BL_1$ and $BL_2$ becomes $V_{XX}$ (=about 10 volts), and the P-channel MOS transistors $PT_{1-1}$, ..., $PT_{1-M}$ of the MOS transistor group $MOS_1$ are turned off. When the other registers are set at "H", each transistor of the switching MOS transistor groups $MOS_2, \ldots, MOS_{K-1}$ between the memory cell array blocks $BL_2, \ldots, BL_K$ are turned on.

In order to read data from the memory cell $M_{1-11}$, it is required to apply a voltage of around 5 volts for reading to the local word line $LW_{1-1}$. In order to erase data from the memory cell array block $BL_2$, it is required to apply a negative voltage of around −10 volts to all the local word lines $LW_{2-1}, \ldots, LW_{2-M}$ of the memory cell array block $BL_2$. In order to set the local word line $LW_{1-1}$ at around 5 volts, the global word line $GW_{1-1}$ is set at around 5 volts by the row decoder $XD_1$, whereby a gate voltage $L_1$ of P-channel MOS transistors between the local word line $LW_{1-1}$ and the global word line $GW_{1-1}$ is set at a negative voltage of around −2 to −5 volts. In order to set the local word lines $LW_{2-1}, \ldots, LW_{2-M}$ at a negative voltage of around −10 volts, it is required to set the global word lines $GW_{2-1}, \ldots, GW_{2-M}$ at a negative voltage of around −10 volts by the row decoder $XD_2$, whereby a gate voltage $L_2$ of P-channel MOS transistors between the global word lines $GW_{2-1}, \ldots, GW_{2-M}$ and the local word lines $LW_{2-1}, \ldots, LW_{2-M}$ is set at a voltage slightly lower than −10 volts, e.g., around −12 volts. Gate voltages $L_3, \ldots, L_K$ of the P-channel MOS transistors between the global word lines and the local word lines in the other blocks are set, for example, at 10 volts so as to turn off the P-channel MOS transistors. The setting of each gate voltage $L_1, \ldots, L_K$ is controlled based on the information specifying the blocks to be operated in parallel and the information indicating which operation (i.e., the read, write, or erase operation) is performed in the blocks.

As described above, even in a flash memory adopting the method for erasing data by applying a negative voltage to word lines, word lines can be electrically isolated. Furthermore, depending upon the data set in the registers $R_1, \ldots, R_{K-1}$, the regions to be independently operated can be arbitrarily set, and the setting can be altered. Thus, the read and write operations, the write and erase operations, and the read and erase operations can be simultaneously performed in the regions operating independently from each other.

As described above, according to the present invention, a very useful non-volatile semiconductor memory device can be realized, in which memory blocks where the read, write, and erase operations are completely independently performed can be arbitrarily selected and altered while minimizing the increase in a layout area by interposing simple switching transistors in series between word lines on the basis of a block to be erased. Furthermore, according to the present invention, word lines are electrically isolated so as to decrease a load capacitance of each word line. Therefore, a read speed can be enhanced. For example, assuming that the block $BL_1$ is assigned as a read-only program (instruction code) storage portion, blocks $BL_2$ to $BL_K$ are assigned as data storage portions in which data is written or erased, the load capacitance of word lines to be driven by the row decoder $XD_1$ decreases. Therefore, the transition speed of the word lines is enhanced, whereby the read speed of the program storage portion can be enhanced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory device, comprising a plurality of memory cell array blocks on a single integrated circuit, each of the blocks including:

non-volatile memory transistors capable of electrically writing, erasing, and reading information, the transistors being arranged in a matrix, and sources of all of the transistors being commonly connected;

a plurality of word lines for commonly connecting control gates of the transistors in each identical row of the matrix;

a plurality of bit lines for commonly connecting drains of the transistors in each identical column of the matrix;

a bit line selection circuit for selectively connecting the plurality of bit lines to a data bus in accordance with a signal value of a first predetermined portion of an input address signal; and a voltage selection output circuit for selectively outputting a predetermined voltage to the commonly connected sources at a time of writing, erasing, or reading information;

wherein the plurality of word lines of each of the blocks are respectively connected to the corresponding word lines in an adjacent block through a group of switching transistors provided between the blocks, at least two word line selection circuits are further included which output a predetermined word line selection signal in accordance with a signal value of a second predetermined portion of the input address signal, the plurality of word lines of a predetermined pair of two blocks among the plurality of blocks are respectively connected to the corresponding word line selection circuits, and each of the bit line selection circuits connects the bit line selected in accordance with the signal value of the first predetermined portion of the input address signal alternatively to either of the two data buses.

2. The non-volatile semiconductor memory device according to claim 1, wherein the gates of the plurality of switching transistors provided between the blocks are commonly connected on an inter-block basis and supplied with a predetermined transistor ON or OFF voltage.

3. The non-volatile semiconductor memory device according to claim 2, further comprising a storage circuit whose stored content is variable, and a transistor switching voltage output circuit for selectively outputting the transistor ON or OFF voltage in accordance with the content stored in the storage circuit.

4. The non-volatile semiconductor memory device according to claim 2, wherein each of the groups of switching transistors includes N channel MOS transistors and P channel MOS transistors respectively connected to the corresponding word lines of the adjacent blocks.

5. The non-volatile semiconductor memory device according to claim 2, wherein the plurality of the word lines of each of the blocks respectively include:

global word lines for connecting between the blocks; and local word lines for commonly connecting the control gates of the transistors of each identical row of the matrix within each block, and respectively connected to the global word lines.

* * * * *